United States Patent
Yashima

(10) Patent No.: US 9,875,876 B2
(45) Date of Patent: Jan. 23, 2018

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventor: Jun Yashima, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/384,897

(22) Filed: Dec. 20, 2016

(65) Prior Publication Data

US 2017/0200582 A1    Jul. 13, 2017

(30) Foreign Application Priority Data

Jan. 8, 2016   (JP) .................................. 2016-002676

(51) Int. Cl.
H01J 37/147   (2006.01)
H01J 37/317   (2006.01)

(52) U.S. Cl.
CPC ...... H01J 37/1472 (2013.01); H01J 37/3174 (2013.01); H01J 2237/3175 (2013.01)

(58) Field of Classification Search
USPC ........................................................ 250/400
See application file for complete search history.

(56) References Cited

U.S. PATENT DOCUMENTS

| 4,837,447 | A  | * | 6/1989  | Pierce ................... G03F 7/2022 |
|           |    |   |         | 250/398 |
| 8,183,545 | B2 | * | 5/2012  | Yashima ................ B82Y 10/00 |
|           |    |   |         | 250/306 |
| 8,779,394 | B2 | * | 7/2014  | Inoue .................. H01J 37/3174 |
|           |    |   |         | 250/492.1 |
| 9,224,578 | B2 | * | 12/2015 | Nakayamada ...... H01J 37/3174 |
| 2017/0124247 | A1 | * | 5/2017 | Fujimura ............ G06F 17/5081 |

FOREIGN PATENT DOCUMENTS

| JP | 2001-196297 | 7/2001 |
| JP | 2012-69675 | 4/2012 |
| JP | 2012-243842 | 12/2012 |
| JP | 2015-188014 | 10/2015 |
| TW | 201225147 A1 | 6/2012 |
| TW | 201443642 A | 11/2014 |
| TW | 201506531 A | 2/2015 |
| TW | 201515048 A | 4/2015 |

OTHER PUBLICATIONS

Taiwanese Office Action dated Nov. 27, 2017, issued in Taiwanese Patent Application No. 105141629.

* cited by examiner

*Primary Examiner* — Phillip A Johnston
(74) *Attorney, Agent, or Firm* — Oblon, McClelland, Maier & Neustadt, L.L.P.

(57) ABSTRACT

A charged particle beam writing apparatus according to an embodiment starts a wiring operation when the sum of the amount of shot data stored in a buffer memory of a transfer control calculator, the amount of shot data being transferred by a transfer unit, and the amount of shot data stored in a buffer memory of a deflection control circuit reaches the amount of data for one stripe region.

10 Claims, 4 Drawing Sheets

HEAT CORRECTION WITHOUT TAKING INTO ACCOUNT
HEAT TRANSFER FROM PREVIOUS DPB REGIONS

NORMAL HEAT CORRECTION

CHARGED PARTICLE BEAM WRITING APPARATUS AND CHARGED PARTICLE BEAM WRITING METHOD

CROSS REFERENCE TO RELATED APPLICATION

This application is based upon and claims benefit of priority from the Japanese Patent Application No. 2016-2676, filed on Jan. 8, 2016, the entire contents of which are incorporated herein by reference.

FIELD

The present invention relates to a charged particle beam writing apparatus and a charged particle beam writing method.

BACKGROUND

As the integration density of LSIs increases, the circuit line widths of semiconductor devices become narrower year by year. Forming a desired circuit pattern on a semiconductor device involves using a technique in which a high-precision original pattern (also referred to as a mask, or particularly referred to as a reticle if it is used in a stepper or scanner) formed on a quartz member is transferred in a reduced form onto a wafer using a step-and-repeat exposure system. The high-precision original pattern is written by an electron beam writing apparatus using a so-called electron beam lithography technique.

In the electron beam writing apparatus, writing data input from the outside is distributed in units of predetermined calculation regions among a plurality of calculators, which concurrently perform data conversion operations to reduce data processing time. After the concurrent data conversion, the resulting data is temporarily input to a transfer processing device, and then transferred to a deflection control circuit in writing order. The deflection control circuit determines the amount of deflection of a beam on the basis of the transferred data, and deflects the beam to irradiate a mask substrate. The mask substrate is placed on a stage that continuously moves.

If data transfer from the transfer processing device to the deflection control circuit is too slow to prevent interruption of data for a region that is being written to, the writing process is stopped. Then, a so-called recovery process is performed, which involves returning the stage to a position where writing has been accurately performed and then resuming the writing process after writing data is transferred.

As optical lithography technology develops and the wavelengths shorten because of the use of EUV, the number of electron beam shots required for mask writing increases. At the same time, to ensure line width precision required for narrowing the line widths, the resist sensitivity is lowered and the dose is increased to reduce shot noise and pattern edge roughness. The writing time increases as the number of shots and the dose increase. Increasing the current density is under consideration to shorten the writing time.

However, in an attempt to emit an increased amount of irradiation energy in a short time in the form of a higher-density electron beam, a phenomenon of so-called resist heating occurs, in which an increase in substrate temperature causes a change in resist sensitivity and degrades the line width precision. To solve this problem, a technique has been proposed, which involves calculating, for each minimum deflection region in deflection regions, a representative temperature of the minimum deflection region based on heat transfer from other minimum deflection regions that have been previously written to, and modulating a dose using the representative temperature (see, e.g., Japanese Unexamined Patent Application Publication No. 2012-69675).

If a recovery process, such as that described above, occurs during the writing process performed using the dose modulated by taking into account the heat transfer from other regions, the substrate temperature drops while the stage position is being returned. Therefore, when, after the writing operation is resumed, writing is performed using the dose that takes into account the heat transfer, desired line width precision cannot be achieved.

DETAILED DESCRIPTION

In one embodiment, a charged particle beam writing apparatus includes a data converter dividing a writing region of a mask substrate into a plurality of stripe regions, and performing data conversion on writing data for each of a plurality of processing regions obtained by dividing each of the stripe regions, a first buffer memory storing processing data corresponding to each of the processing regions having been subjected to the data conversion by the data converter, a transfer control calculator transferring the processing data in the first buffer memory in writing order, a dose modulating processing circuitry dividing the writing region into a plurality of temperature calculation regions of a predetermined size, determining for each of the temperature calculation regions the amount of temperature rise based on heat transfer from preceding temperature calculation regions in the writing order, and modulating a dose included in the processing data in the first buffer memory on the basis of the amount of temperature rise, a second buffer memory storing the processing data transferred from the transfer control calculator, a deflection control circuit controlling an amount of deflection of a charged particle beam on the basis of the processing data for each of the processing regions stored in the second buffer memory, a writing device deflecting the charged particle beam on the basis of the amount of deflection, and writing a pattern on the mask substrate placed on a movable stage, and a control device controlling the writing device such that a writing process is started when processing data for N1 or more processing regions, where N1 is an integer greater than or equal to 1, is stored in the second buffer memory, and a sum of the processing data stored in the first buffer memory, the processing data stored in the second buffer memory, and the processing data being transferred by the transfer control calculator becomes greater than or equal to an amount of processing data for N2 processing regions, where N2 is an integer greater than N1.

The following embodiments will describe a configuration that uses an electron beam as a charged particle beam. Note, however, that the charged particle beam is not limited to an electron beam, and may be another beam using charged particles, such as an ion beam.

Figure 1:
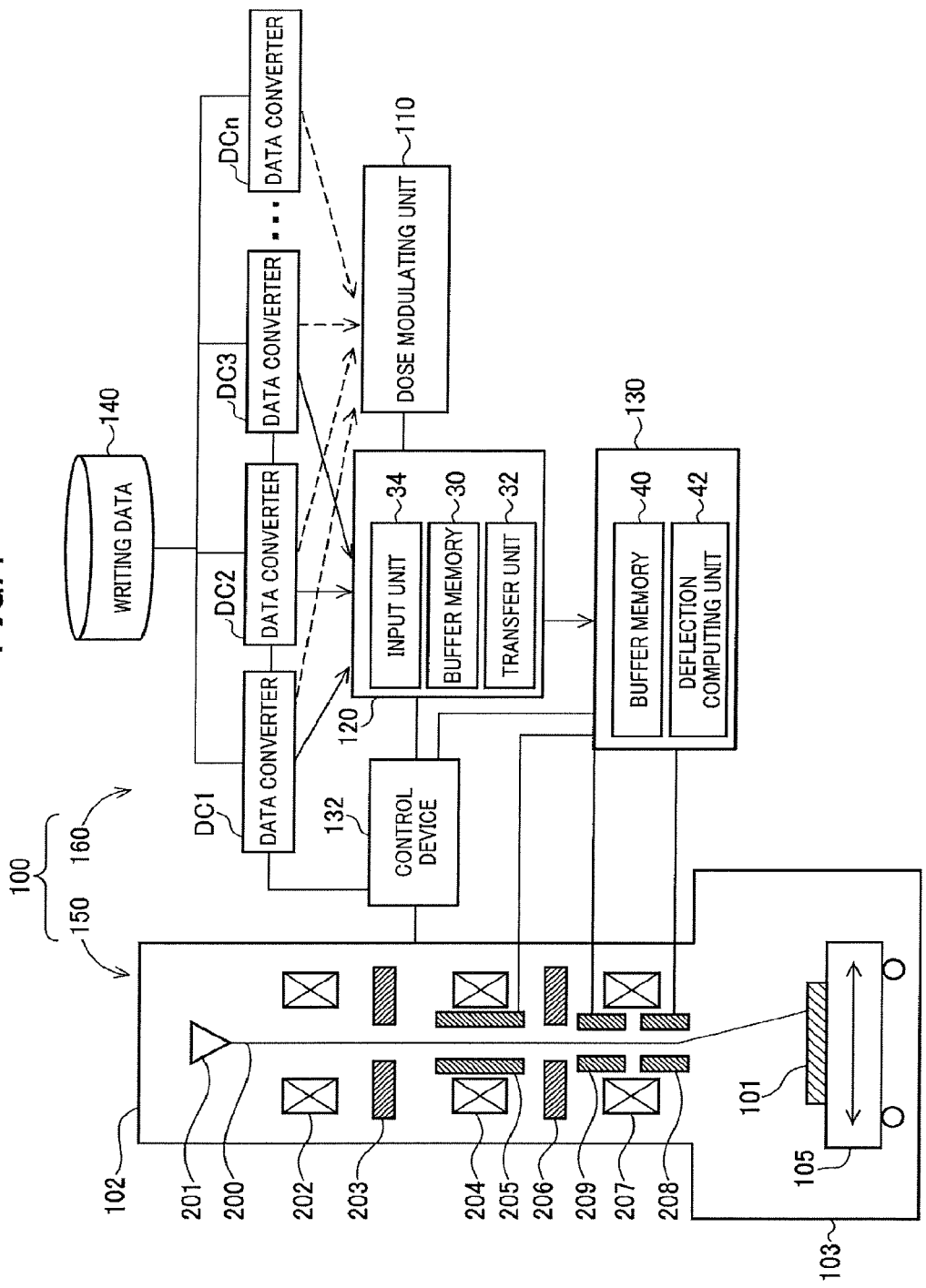
FIG. 1 illustrates a schematic configuration of a writing apparatus according to an embodiment of the present invention.

FIG. 1 is a conceptual diagram illustrating a configuration of a writing apparatus according to an embodiment of the present invention. In FIG. 1, a writing apparatus 100 includes a writing unit (writing device) 150 and a control unit 160. The writing apparatus 100 is a charged particle beam writing apparatus, and is in particular, a variable-shaped beam writing apparatus. The writing unit 150 includes an electron lens barrel 102 and a writing chamber 103. The electron lens barrel 102 includes an electron gun 201, an illumination lens 202, a first aperture 203, a projection lens 204, a deflector 205, a second aperture 206, an objective lens 207, a main deflector 208, and a sub-deflector 209.

An XY stage 105 is placed in the writing chamber 103. A mask substrate 101 to be written to is on the XY stage 105 during writing. The mask substrate 101 includes an exposure mask used to manufacture semiconductor devices. The mask substrate 101 also includes mask blanks to which a resist is applied and nothing has been written.

The control unit 160 includes a plurality of data converters DC1 to DCn, a dose modulating unit 110, a data transfer calculator 120, a deflection control circuit 130, a control device 132, and a storage device 140, such as a magnetic disk device. The plurality of data converters DC1 to DCn, the data transfer calculator 120, the deflection control circuit 130, the control device 132, and the storage device 140 are connected to each other via a bus.

The plurality of data converters DC1 to DCn (n is an integer greater than or equal to 2) each include a plurality of CPUs and a plurality of memories.

The data transfer calculator 120 includes an input unit 34, a buffer memory 30, and a transfer unit 32. The functions of the input unit 34 and the transfer unit 32 may be configured by hardware, such as an electric circuit, or by software, such as a program implementing these functions. When these functions are configured by software, a program implementing these functions may be stored in a recording medium, and read and executed by a computer including an electric circuit. The recording medium is not limited to a removable recording medium, such as a magnetic disk or an optical disk, and may be a fixed recording medium, such as a hard disk drive or a memory.

The deflection control circuit 130 includes a buffer memory 40 and a deflection computing unit 42.

FIG. 1 illustrates components necessary to describe the embodiments, and the writing apparatus 100 may include other components. For example, in FIG. 1, a multistage deflector of two (main and sub-) stages, composed of the main deflector 208 and the sub-deflector 209, is provided for deflecting the position of beam irradiation. However, a single-stage deflector or a multistage deflector of three or more stages may be provided for the positional deflection.

Writing data in which the positions and sizes of a plurality of figure patterns are defined is input from the outside and stored in the storage device 140.

Figure 2:
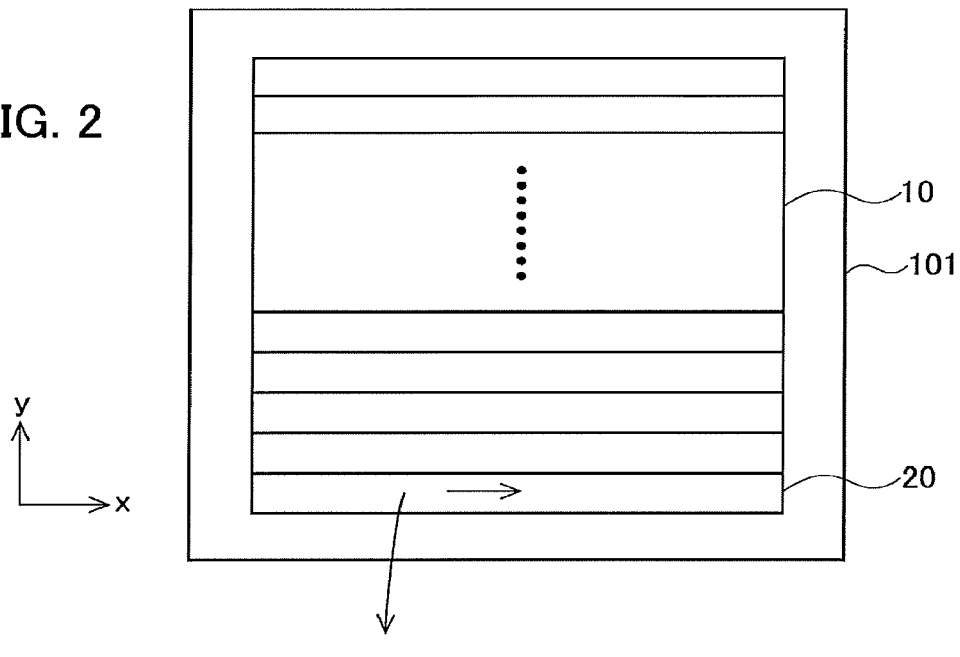
FIG. 2 illustrates an example of how a writing region is divided.
Figure 2:
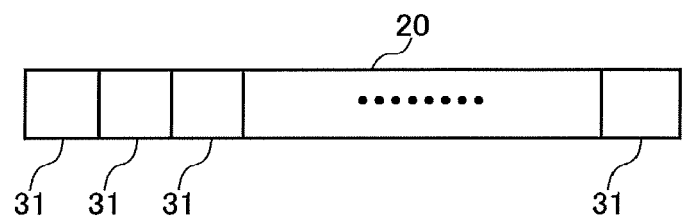

FIG. 2 is a conceptual diagram for explaining each region according to an embodiment. In FIG. 2, a writing region 10 of the mask substrate 101 is virtually divided into a plurality of strip-shaped stripe regions 20 each having a width that allows deflection in the X or Y direction by the main deflector 208. Each of the stripe regions 20 is divided into a plurality of block-shaped calculation processing unit regions (DPB) 31.

The data converters DC1 to DCn each read writing data in units of DPB regions 31 from the storage device 140, perform multiple stages of data conversion, and generate shot data specific to the apparatus.

For the writing apparatus 100 to write figure patterns, each figure pattern defined in the writing data needs to be divided into pieces of a size that can be irradiated by one beam shot. Accordingly, the plurality of data converters DC1 to DCn divide each figure pattern defined in the writing data into shot figures of a size that can be irradiated by one beam shot. Then, the data converters DC1 to DCn generate shot data for each of the shot figures. Data, such as a figure type, a figure size, an irradiation position, and a dose, is defined in the shot data.

Writing order information indicating the order of wiring may be defined in the header of each shot data. For example, an ID (identifier or address) of each DPB region may be used as the writing order information.

The data converters DC1 to DCn output the generated shot data to the data transfer calculator 120 in units of DPB regions 31. The data converters DC1 to DCn concurrently perform data processing operations to achieve high-speed data processing.

The input unit 34 of the data transfer calculator 120 performs input processing on the shot data output in units of DPB regions 31 from the data converters DC1 to DCn, and stores the shot data in the buffer memory 30. The transfer unit 32 arranges the shot data in writing order in units of DPB regions 31, and outputs the shot data to the deflection control circuit 130. The shot data output to the deflection control circuit 130 is deleted from the buffer memory 30.

The data converters DC1 to DCn output the generated shot data also to the dose modulating unit 110. The dose modulating unit 110 includes a buffer memory (not shown), and stores the shot data input from the data converters DC1 to DCn in the buffer memory. The dose modulating unit 110 virtually divides the writing region into a mesh of small regions (temperature calculation regions) of a predetermined size, and calculates, for each of the small regions, the amount of temperature rise caused by heat transfer from other small regions that have been previously written to. On the basis of the calculated amount of temperature rise, the dose modulating unit 110 modulates the dose in the shot data stored in the buffer memory 30 such that dimensional changes in patterns caused by resist heating can be reduced. A known method can be used for such resist heating correction.

The buffer memory 40 of the deflection control circuit 130 sequentially stores the shot data for the DPB regions 31 arranged in the writing order and transferred from the transfer unit 32. The deflection computing unit 42 reads processing data (shot data) from the buffer memory 40 in the writing order, and computes the amount of deflection to be made by each of the deflector 205, the main deflector 208, and the sub-deflector 209. Then, the deflection computing unit 42 outputs a digital signal indicating the amount of deflection to a digital-to-analog converter (DAC) amplifier (not shown) for each deflector.

Each DAC amplifier converts the digital signal output from the deflection control circuit 130 into an analog signal, amplifies it, and applies a deflection voltage to the deflector 205, the main deflector 208, and the sub-deflector 209. In accordance with the processing data for each of the DPB regions 31 transferred from the data transfer calculator 120, the deflection control circuit 130 controls the amount of deflection for deflecting an electron beam 200. The writing unit 150 controlled by the control device 132 writes a pattern on the mask substrate 101 by deflecting the electron beam 200 on the basis of the amount of deflection, specifically in the following manner.

The electron beam 200 emitted from the electron gun 201 (emitting unit) illuminates the entire first aperture 203 having a rectangular hole through the illumination lens 202. The electron beam 200 is first shaped into a rectangle here. After passing through the first aperture 203, the electron beam 200 forming a first aperture image is projected through the projection lens 204 onto the second aperture 206.

The deflector 205 can control the deflection of the first aperture image on the second aperture 206 to change the beam shape and dimensions (i.e. to variably shape the beam). After passing through the second aperture 206, the electron beam 200 forming a second aperture image is brought into focus by the objective lens 207, deflected by the main deflector 208 and the sub-deflector 209, and applied to a desired point of the mask substrate 101 on the XY stage 105 that continuously moves.

While following the stage movement, the main deflector 208 deflects a shot of the electron beam 200 to a reference position in a sub-field (SF) obtained by virtually dividing the writing region. The sub-deflector 209 deflects the shot of the beam to each irradiation position in the SF. The writing process is performed for each of the stripe regions 20.

The writing apparatus 100 of the present embodiment determines whether to start a writing process (stage movement) on the basis of the amount of data stored in the buffer memory 30 of the data transfer calculator 120 and the amount of data stored in the buffer memory 40 of the deflection control circuit 130.

The control device 132 monitors the amount of data D1 stored in the buffer memory 40, the amount of data D2 being transferred to the buffer memory 40 by the transfer unit 32, and the amount of data D3 stored in the buffer memory 30.

When the amount of data D1 becomes greater than or equal to a threshold Th1 and the amount of data D1+D2+D3 becomes greater than or equal to a threshold Th2 (Th2>Th1), the control device 132 determines to start the writing process. The threshold Th1 is a value less than or equal to the capacity of the buffer memory 40, and the threshold Th2 is a value less than or equal to the sum of the capacities of the buffer memory 30 and the buffer memory 40.

Figure 3:
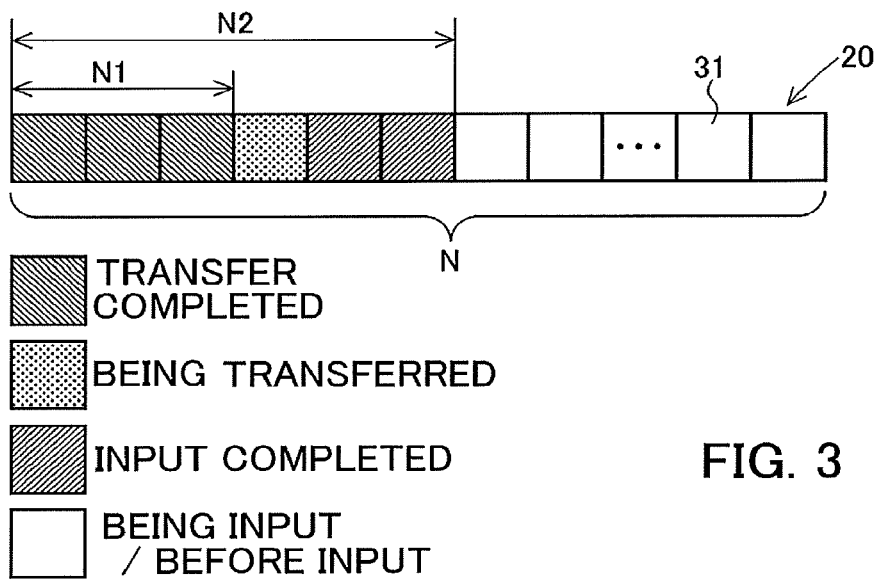
FIG. 3 illustrates a writing start condition.

For example, if the threshold Th1 represents the amount of processing data (shot data) for N1 DPB regions and the threshold Th2 represents the amount of processing data for N2 DPB regions, the writing process is started when, as illustrated in FIG. 3, processing data for the first to N1-th DPB regions 31 of N DPB regions 31 included in one stripe region 20 is stored in the buffer memory 40, and processing data for the (N1+1)-th to N2-th DPB regions 31 is stored in the buffer memory 30 or being transferred to the buffer memory 40.

In FIG. 3, "transfer completed" means that processing data for the DPB region has been transferred from the data transfer calculator 120 and stored in the buffer memory 40, "being transferred" means that processing data for the DPB region is being transferred from the data transfer calculator 120 to the buffer memory 40, and "input completed" means that processing data output from the data converters DC1 to DCn has been stored in the buffer memory 30. Also, "being input/before input" means that processing data for the DPB region is being input to the buffer memory 30, data for the DPB region is being processed by the data converters DC1 to DCn, or data for the DPB region has not yet been processed.

Processing data is managed in units of DPB regions. The control device 132 can keep track of which of the following states "transfer completed", "being transferred", "input completed", and "being input/before input" each DPB region in one stripe region 20 is in.

If the threshold Th2 represents the amount of processing data for the N DPB regions or the amount of processing data for one stripe region, the condition, the amount of data D1+D2+D3≥Th2, indicates that for all the DPB regions included in one stripe region 20, at least generation and output of shot data by the data converters DC1 to DCn and storage of the shot data into the buffer memory 30 have been completed.

As described above, in the present embodiment, a writing process is started when the writing start condition that shot data of an amount greater than or equal to the threshold Th1 has been stored in the buffer memory 40 and shot data of an amount greater than or equal to the threshold Th2 has been prepared is satisfied. Thus by starting the writing process after a sufficient amount of data is prepared, it is possible to reduce interruption of shot data and occurrence of a recovery process during writing.

In particular, when the threshold Th2 represents the amount of processing data for one stripe region, the writing process is started after shot data for all the DPB regions 31 included in the stripe region 20 is generated. In this case, shot data is rarely interrupted during writing and the occurrence of a recovery process can be reduced. Also, since the dose is modulated by taking into account heat transfer from other regions, dimensional changes in patterns caused by resist heating can be reduced.

If processing data for one stripe region is extremely large, the processing data for the one stripe region cannot be stored in the buffer memory 30 and the buffer memory 40.

Figure 4:
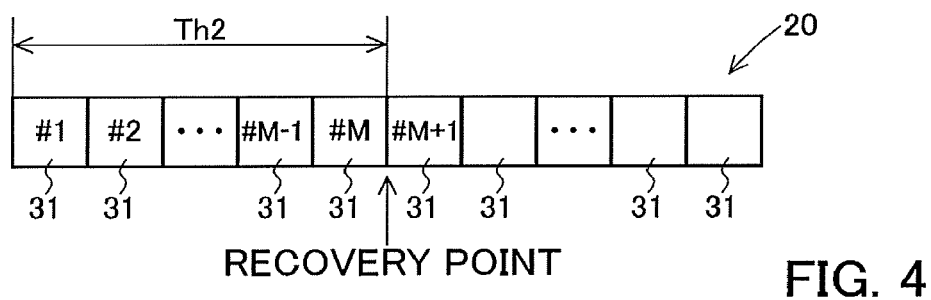
FIG. 4 illustrates an example of how a recovery point is set.

If processing data for one stripe region is extremely large as in this case, a recovery point is set at the position of the threshold Th2, as illustrated in FIG. 4, to artificially (or forcibly) start a recovery process. When the recovery process occurs, the writing process is temporarily stopped. Then, when the writing start condition that the amount of data D1 is greater than or equal to the threshold Th1 and the amount of data D1+D2+D3 is greater than or equal to the threshold Th2 is satisfied again, the stage 105 is returned to a writing target position of the mask substrate 101 (i.e., a position where writing has been accurately performed) and then the writing process is resumed.

The threshold Th2 is set, for example, to a value that is less than or equal to the sum of the capacities of the buffer memory 30 and the buffer memory 40 and close to the sum of the capacities. For example, in the case of "the amount of processing data for M DPB regions"≤"the sum of the capacities"<"the amount of processing data for (M+1) DPB regions", the threshold Th2 is a value representing the amount of processing data for the M DPB regions as illustrated in FIG. 4. A recovery point is set at the position after the M-th DPB region 31 and before the (M+1)-th DPB region 31.

A method for starting a recovery process at a recovery point is not particularly limited. For example, when the transfer unit 32 stops transfer of shot data to the deflection control circuit 130 after the recovery point, the shot data is interrupted and the writing process is stopped. After the writing process is stopped, the transfer unit 32 resumes the data transfer.

Alternatively, a recovery flag may be added to shot data before and after the recovery point. In this case, a recovery process is started when the deflection control circuit 130 detects the flag.

The recovery process is performed after completion of the writing process for the first to M-th DPB regions 31. Since the beam is not emitted during the recovery process, the temperature of the mask substrate 101 drops. Therefore, for the (M+1)-th DPB region 31 which is a DPB region immediately after the occurrence of the recovery process, the dose modulating unit 110 modulates the dose in shot data without taking into account heat transfer from DPB regions (the first to M-th DPB regions) that have been previously written to. In other words, for the (M+1)-th DPB region 31, the same calculation as that for the first DPB region 31 is performed to modulate the dose.

Figure 5:
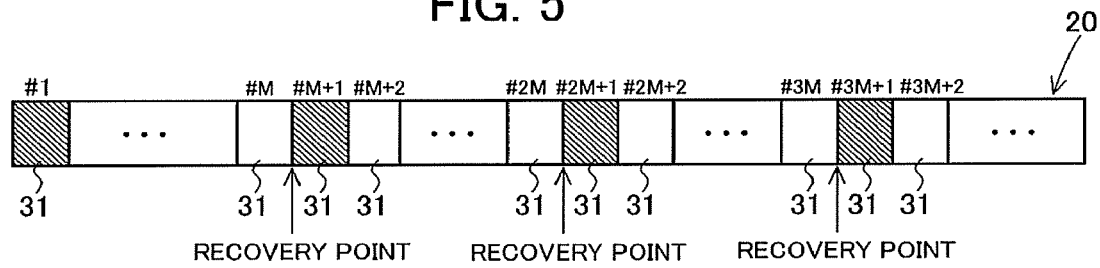
FIG. 5 illustrates another example of how a recovery point is set.
Figure 5:
Figure 5:

Then, a recovery point is set every M DPB regions. For example, as illustrated in FIG. 5, a recovery point is set at the position after the 2M-th DPB region 31 and before the (2M+1)-th DPB region 31. Another recovery point is set at the position after the 3M-th DPB region 31 and before the (3M+1)-th DPB region 31. For the (2M+1)-th and (3M+1)-th DPB regions 31, the same dose modulation (heating correction) as that for the first DPB region 31 is performed without taking into account heat transfer from other DPB regions that have been previously written to. For the (M+2)-th to 2M-th DPB regions 31 and the (2M+2)-th to 3M-th DPB regions 31, normal heat correction that takes into account heat transfer from other DPB regions having been previously written to is performed.

For example, the control device 132 determines the amount of shot data for one stripe region. Then, if the amount of data determined is greater than or equal to the sum of the capacities of the buffer memory 30 and the buffer memory 40, the control device 132 determines to set a recovery point. The control device 132 controls the data transfer calculator 120, the deflection control circuit 130, and the writing unit 150 such that a recovery process occurs at the recovery point. For the DPB region 31 immediately after the recovery point, the control device 132 controls the dose modulating unit 110 to perform dose modulation that does not take into account heat transfer from preceding DPB regions in the writing order.

As described above, if processing data for one stripe region is too large to be stored in the buffer memory 30 and the buffer memory 40, a recovery process is artificially started in the middle of the stripe region 20. For the first DPB region 31 after the writing operation is resumed, heating correction is performed without taking into account heat transfer from regions that have been previously written to, or in other words, heating correction is performed by taking into account a drop in the temperature of the mask substrate 101 caused by the recovery process.

After a recovery process is started at a recovery point, the writing process is resumed when a predetermined writing start condition is satisfied. It is thus possible to reduce the occurrence of a recovery process, except the one that is artificially started at the recovery point. For the first DPB region 31 after the writing operation is resumed, heating correction is performed without taking into account heat transfer from regions that have been previously written to, whereas for other DPB regions 31, normal heating correction that takes into account heat transfer from other regions is performed. It is thus possible to reduce dimensional changes in patterns caused by resist heating.

When a recovery process is artificially started at a recovery point, it is not necessarily required to satisfy the writing start condition that the amount of data D1 is greater than or equal to the threshold Th1 and the amount of data D1+D2+D3 is greater than or equal to the threshold Th2. Instead, a recovery point may be simply set at the position of the threshold Th2 to start a recovery process. By setting a recovery point in advance as described above, it is possible to reduce the time before the start of writing operation.

At least part of the control device 132 described in the above embodiments may be implemented in either hardware such as electric circuits or software. When implemented in software, a program that realizes at least part of functions of the control device 132 may be stored on a recording medium and read and executed by a computer including electric circuits.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:
 a data converter dividing a writing region of a mask substrate into a plurality of stripe regions, and performing data conversion on writing data for each of a plurality of processing regions obtained by dividing each of the stripe regions;
 a first buffer memory storing processing data corresponding to each of the processing regions having been subjected to the data conversion by the data converter;
 a transfer control calculator transferring the processing data in the first buffer memory in writing order;
 a dose modulating processing circuitry dividing the writing region into a plurality of temperature calculation regions of a predetermined size, determining for each of the temperature calculation regions the amount of temperature rise based on heat transfer from preceding temperature calculation regions in the writing order, and modulating a dose included in the processing data in the first buffer memory on the basis of the amount of temperature rise;
 a second buffer memory storing the processing data transferred from the transfer control calculator;
 a deflection control circuit controlling an amount of deflection of a charged particle beam on the basis of the processing data for each of the processing regions stored in the second buffer memory;
 a writing device deflecting the charged particle beam on the basis of the amount of deflection, and writing a pattern on the mask substrate placed on a movable stage; and
 a control device controlling the writing device such that a writing process is started when processing data for N1 or more processing regions, where N1 is an integer greater than or equal to 1, is stored in the second buffer memory, and a sum of the processing data stored in the first buffer memory, the processing data stored in the second buffer memory, and the processing data being transferred by the transfer control calculator becomes greater than or equal to an amount of processing data for N2 processing regions, where N2 is an integer greater than N1.

2. The apparatus according to claim 1, wherein the control device controls the writing device such that when a data size of processing data for the entire stripe region is greater than or equal to a predetermined value, the writing process is stopped after completion of writing to the N2 processing regions, and a recovery process involving returning the stage to a writing target position of the mask substrate is performed.

3. The apparatus according to claim 2, wherein the predetermined value is a sum of capacities of the first buffer memory and the second buffer memory.

4. The apparatus according to claim 2, wherein for the (N2+1)-th processing region, the dose modulating processing circuitry modulates the dose without taking into account heat transfer from processing regions that have been previously written to.

5. The apparatus according to claim 2, wherein after transferring the processing data for the N2 processing regions to the deflection control circuit, the transfer control calculator stops the transfer of processing data and resumes the transfer of processing data after the writing process is stopped.

6. The apparatus according to claim 1, wherein the control device controls the writing device such that when a data size of processing data for the entire stripe region is less than a predetermined value, the writing process is started if processing data for all the processing regions in the stripe region is stored in the first buffer memory, being transferred by the transfer control calculator, or stored in the second buffer memory.

7. The apparatus according to claim 1, wherein a plurality of data converters are provided, and the plurality of data converters concurrently perform the data conversion.

8. A charged particle beam writing method comprising:
dividing a writing region of a mask substrate into a plurality of stripe regions, and performing data conversion on writing data for each of a plurality of processing regions obtained by dividing each of the stripe regions;
storing processing data corresponding to each of the processing regions having been subjected to the data conversion in a first buffer memory;
transferring the processing data in the first buffer memory in writing order by a transfer control calculator;
dividing the writing region into a plurality of temperature calculation regions of a predetermined size, determining for each of the temperature calculation regions the amount of temperature rise based on heat transfer from preceding temperature calculation regions in the writing order, and modulating a dose included in the processing data in the first buffer memory on the basis of the amount of temperature rise;
storing the processing data transferred from the transfer control calculator in a second buffer memory, and controlling the amount of deflection of a charged particle beam on the basis of the processing data for each of the processing regions stored in the second buffer memory; and
deflecting the charged particle beam on the basis of the amount of deflection, and writing a pattern on the mask substrate placed on a movable stage,
wherein a writing process is started when processing data for N1 or more processing regions, where N1 is an integer greater than or equal to 1, is stored in the second buffer memory, and a sum of the processing data stored in the first buffer memory, the processing data stored in the second buffer memory, and the processing data being transferred by the transfer control calculator becomes greater than or equal to an amount of processing data for N2 processing regions, where N2 is an integer greater than N1.

9. The method according to claim 8, wherein when a data size of processing data for the entire stripe region is greater than or equal to a predetermined value, the writing process is stopped after completion of writing to the N2 processing regions, a recovery process involving returning the stage to a writing target position of the mask substrate is performed, and for the first processing region after resumption of writing, the dose is modulated without taking into account heat transfer from processing regions that have been previously written to.

10. The method according to claim 8, wherein when a data size of processing data for the entire stripe region is less than a predetermined value, the writing process is started if processing data for all the processing regions in the stripe region is stored in the first buffer memory, being transferred by the transfer control calculator, or stored in the second buffer memory.

* * * * *